(12) United States Patent
Li et al.

(10) Patent No.: US 12,117,673 B2
(45) Date of Patent: Oct. 15, 2024

(54) SMART GLASSES

(71) Applicant: GOERTEK INC., Shandong (CN)

(72) Inventors: Guanyou Li, Shandong (CN); Bin Jiang, Shandong (CN); Xiaoyu Chi, Shandong (CN)

(73) Assignee: GOERTEK INC., Shandong (CN)

( * ) Notice: Subject to any disclaimer, the term of this patent is extended or adjusted under 35 U.S.C. 154(b) by 509 days.

(21) Appl. No.: 17/594,132

(22) PCT Filed: Dec. 28, 2019

(86) PCT No.: PCT/CN2019/129525
§ 371 (c)(1),
(2) Date: Oct. 4, 2021

(87) PCT Pub. No.: WO2021/017401
PCT Pub. Date: Feb. 4, 2021

(65) Prior Publication Data
US 2022/0171219 A1 Jun. 2, 2022

(30) Foreign Application Priority Data
Jul. 26, 2019 (CN) .......................... 201910679519.X

(51) Int. Cl.
*G02C 11/00* (2006.01)
*G02C 5/14* (2006.01)
(Continued)

(52) U.S. Cl.
CPC .............. *G02C 11/10* (2013.01); *G02C 5/146* (2013.01); *H05K 7/2039* (2013.01)

(58) Field of Classification Search
None
See application file for complete search history.

(56) References Cited

U.S. PATENT DOCUMENTS 9,423,842 B2 8/2016 Osterhout et al.
11,086,140 B1 * 8/2021 Ashwood ............... G02C 5/143
(Continued)

FOREIGN PATENT DOCUMENTS

CN 105005156 10/2015
CN 108885358 A 11/2018
(Continued)

OTHER PUBLICATIONS

International Search Report from PCT/CN2019/129525 filed Dec. 28, 2019, mailed Apr. 22, 2020.
(Continued)

*Primary Examiner* — Darryl J Collins
(74) *Attorney, Agent, or Firm* — HAUPTMAN HAM, LLP

(57) ABSTRACT

Provided is a pair of smart glasses. The smart glasses include a front frame, and legs rotatably connected to the front frame through a rotating module. A heat conducting structure is housed in the rotating module. The heat conducting structure includes an upper flange and a lower flange that are closely fitted in an up and down direction and rotatable relative to each other. The upper flange is connected to a front frame heat pipe provided in the front frame, and the lower flange is connected to a leg heat pipe provided in the legs and rotates with the leg heat pipe.

13 Claims, 3 Drawing Sheets

(51) Int. Cl.
    *G02C 5/22*         (2006.01)
    *H05K 7/20*        (2006.01)

(56)             References Cited

U.S. PATENT DOCUMENTS

| | | |
|---|---|---|
| 2008/0074609 A1 | 3/2008 | Ifergan |
| 2013/0278631 A1* | 10/2013 | Border ................ G06F 3/04842 |
| | | 345/633 |
| 2017/0248799 A1 | 8/2017 | Streets et al. |
| 2019/0129200 A1 | 5/2019 | Moskowitz et al. |
| 2022/0107445 A1* | 4/2022 | Godeau .................. G02C 11/10 |
| 2023/0194899 A1* | 6/2023 | Su ........................... G02C 5/14 |
| | | 351/111 |

FOREIGN PATENT DOCUMENTS

| | | |
|---|---|---|
| CN | 208156339 | 11/2018 |
| CN | 109143587 | 1/2019 |
| CN | 208885766 U | 5/2019 |
| CN | 208902976 U | 5/2019 |
| CN | 110471196 A | 11/2019 |
| WO | 2018126117 A2 | 7/2018 |

OTHER PUBLICATIONS

Chinese Office Action issued in Application No. 201910679519.X dated Mar. 12, 2020.

* cited by examiner

SMART GLASSES

The present application is a National Stage application of PCT international patent application PCT/CN2019/129525, filed on Dec. 28, 2019 which claims the priority to Chinese Patent Application No. 201910679519.X, titled "SMART GLASSES", filed on Jul. 26, 2019 with the China National Intellectual Property Administration, both of which are incorporated herein by reference in their entireties.

FIELD

The present application relates to the technical field of glasses, and in particular to a pair of smart glasses.

BACKGROUND

With the development of technology, smart glasses are equipped with more and more electronic components to be more functional, which increases the workload of the processor, so the heat dissipation performance of smart glasses has a great influence on the user experience.

For ordinary smart glasses, legs and a frame are connected by a rotating connection structure, heat generated inside the legs may only be dissipated through the legs, so a heat dissipation area is limited; a large amount of heat accumulates at the legs, which affects the user experience.

SUMMARY

In view of the above shortcomings, a technical problem to be addressed by the present application is to provide a pair of smart glasses in which two legs and a frame are rotatably connected by a rotating module with a built-in heat conducting structure. Heat generated inside the legs is conducted to the frame through the heat conducting structure, and is dissipated outward through the frame, which improves an overall heat dissipation performance of the glasses, thereby improving the user experience.

In order to solve the above technical problems, technical solutions of the present application are as follows.

A pair of smart glasses, including a front frame, and legs rotatably connected to the front frame through a rotating module; a heat conducting structure is housed in the rotating module, and the heat conducting structure includes an upper flange and a lower flange that are closely fitted in an up and down direction and rotatable relative to each other; the upper flange is connected to a front frame heat pipe provided in the front frame, and the lower flange is connected to a leg heat pipe provided in the legs and rotates with the leg heat pipe.

Preferably, the rotating module includes a cam shaft assembly for outputting rotational torque, and the cam shaft assembly includes a shaft, a torsion spring, a first cam and a second cam, wherein an upper end and a lower end of each of the torsion spring and the first cam are both provided outside the shaft, the second cam is provided on the first cam; a groove is arranged at an end of the first cam facing away from the torsion spring, and the second cam is arranged in the groove; a top end of the shaft is arranged at the bottom end of the lower flange through a supporting element.

Preferably, the rotating module further includes a cylindrical casing and an end cover covering two ends of the cylindrical casing, where the cylindrical casing is fixed on the legs, and the end covers at two ends are fixed on the front frame; a first passage groove and a second passage groove are arranged on a top end of the cylindrical casing; the first passage groove is in communication with the rotating module and the front frame, and the front frame heat pipe passes through the first passage groove and enters the cylindrical casing; the second passage groove is in communication with the rotating module and the legs, and the leg heat pipes passes through the second passage groove and enters the cylindrical casing.

Preferably, the upper flange is provided with a first connecting rod, the first connecting rod is fixedly connected to the front frame heat pipe and is clamped in the first passage groove; the lower flange is provided with a second connecting rod, the second connecting rod is fixedly connected to the leg heat pipe and is clamped in the second passage groove.

Preferably, a sealing ring is provided between the upper flange and the lower flange.

Preferably, a thermal conductive paste is provided between the upper flange and the lower flange.

Preferably, the supporting element is a supporting spring provided vertically.

Preferably, the bottom end of the shaft is fixed on an end cover located at a bottom end of the rotating module through a shaft fixing element.

Preferably, the cam shaft assembly further includes a cylindrical casing, which covers on the outside of the torsion spring, the second cam and a junction of the first cam and the second cam.

Preferably, the smart glasses include a left leg and a right leg which are separately provided on the left and right sides of the front frame; the right leg is rotatably connected to the front frame through the rotating module, and the leg heat pipe is provided inside the right leg; the front frame heat pipe is provided on a right side of the front frame, and the heat conducting structure is provided in the rotating module connected to the right leg; the left leg is rotatably connected to the front frame through the rotating structure, and the rotating structure includes a rotating casing and two fixing end covers covering two ends of the rotating casing; the rotating casing is fixed on the left leg, and the two fixing end covers are fixed on the front frame; the cam shaft assembly is provided inside the rotating structure, and a bottom end of the shaft is mounted on the two fixing end covers located at a bottom end through a fixing element.

By adopting the above technical solutions, beneficial effects of the present application are as follows.

Since the smart glasses of the present application include a front frame, and legs rotatably connected to the front frame through a rotating module; a heat conducting structure is housed in the rotating module, and the heat conducting structure includes an upper flange and a lower flange that are closely fitted in an up and down direction and rotatable relative to each other; the upper flange is connected to a front frame heat pipe provided in the front frame, and the lower flange is connected to a leg heat pipe provided in the legs and rotates with the leg heat pipe. Since the rotating module accommodates the heat conducting structure, the rotating module can not only fold the legs, but also conduct the heat on the leg heat pipes to the front frame. It can be seen that, in the smart glasses of the present application, the legs and a frame are rotatably connected by a rotating module with a built-in heat conducting structure. Heat generated inside the legs is conducted to the frame through the heat conducting structure, and is dissipated outward through the frame, which improves an overall heat dissipation performance of the glasses, thereby improving the user experience.

Since the rotating module includes a cam shaft assembly that is used for outputting rotational torque and is arranged up and down with the heat conducting structure, and the cam shaft assembly includes a shaft, a torsion spring and a first cam, an upper end and a lower end of which are both provided outside the shaft, and a second cam provided on the first cam; a groove is defined at an end of the first cam facing away from the torsion spring, and the second cam is arranged in the groove; a top end of the shaft is arranged at the bottom end of the lower flange through a supporting element; with the cam shaft assembly, legs have a certain clamping effect for users with different head circumferences, and complete folding of the legs are achieved.

Since the rotating module further includes a cylindrical casing and an end cover covering two ends of the cylindrical casing, where the cylindrical casing is fixed on the legs, and the end cover at two ends are fixed on the front frame; a first passage groove and a second passage groove are defined on a top end of the cylindrical casing; the first passage groove is in communication with the rotating module and the front frame, and the front frame heat pipe is provided inside the first passage groove; the second passage groove is in communication with the rotating module and the legs, and the leg heat pipes are provided inside the second passage groove. In the above structure, the cylindrical casing enables the upper flange and the lower flange to not only perform good heat conduction, but also rotate relatively in cooperation.

Since the sealing ring is provided between the upper flange and the lower flange, the lower flange and the upper flange are closely attached while relative rotation is ensured.

Since the thermal conductive paste is provided between the upper flange and the lower flange, the lower flange and the upper flange are fully contacted and heat conduction is ensured.

Since the supporting element is a supporting spring provided vertically, the supporting spring bears the weight of the lower flange, so that the lower flange and the upper flange are closely attached, which improves the heat conduction efficiency.

BRIEF DESCRIPTION OF THE DRAWINGS

For more clearly illustrating embodiments of the present disclosure or the technical solutions in the conventional technology, drawings referred to for describing the embodiments or the conventional technology will be briefly described hereinafter. Apparently, drawings in the following description are only examples of the present disclosure, and for the person skilled in the art, other drawings may be obtained based on the provided drawings without any creative efforts.

REFERENCE NUMERALS IN FIG. 1 TO FIG. 5

1—front frame, 10—front casing of front frame, 12—rear casing of front frame, 2—leg, 20—leg casing, 22—leg inner casing, 3—front frame heat pipe, 4—leg heat pipe, 5—cam shaft assembly, 50—shaft, 51—first cam, 52—torsion spring, 53—second cam, 54—cannular casing, 6—shaft fixing element, 7—upper flange, 8—lower flange, 9—sealing ring, 11—supporting spring, 13—rotating module, 130—cylindrical casing, 1301—first passage groove, 1302—second passage groove, 131—end cover, 14—first connecting rod, 15—second connecting rod.

DETAILED DESCRIPTION OF THE EMBODIMENTS

The technical solution according to the embodiments of the present application has been described in conjunction with the drawings. It is apparent that the described embodiments are only a few rather than all of the embodiments according to the present application. Any other embodiments acquired by those skilled in the art based on the embodiments in the present disclosure without any creative efforts fall within the protection scope of the present disclosure.

Figure 1:
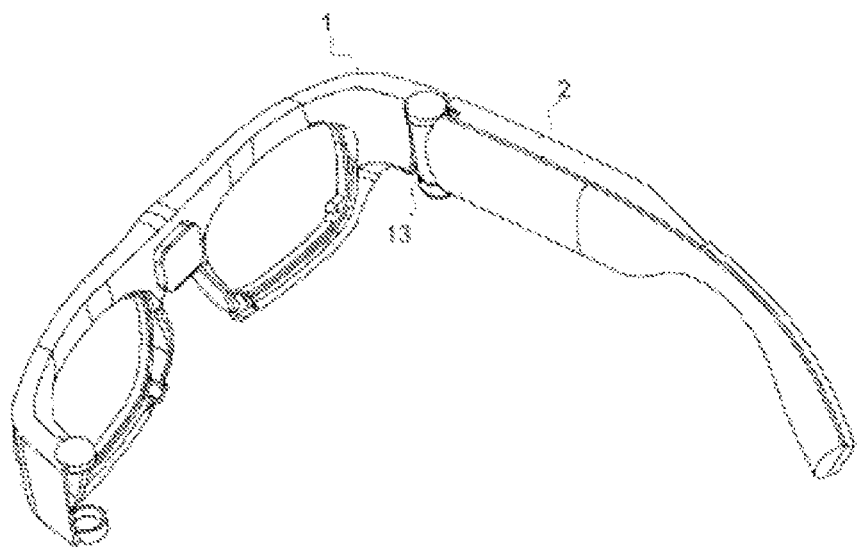
FIG. 1 is a schematic structural diagram of a pair of smart glasses provided by the present application.
Figure 2:
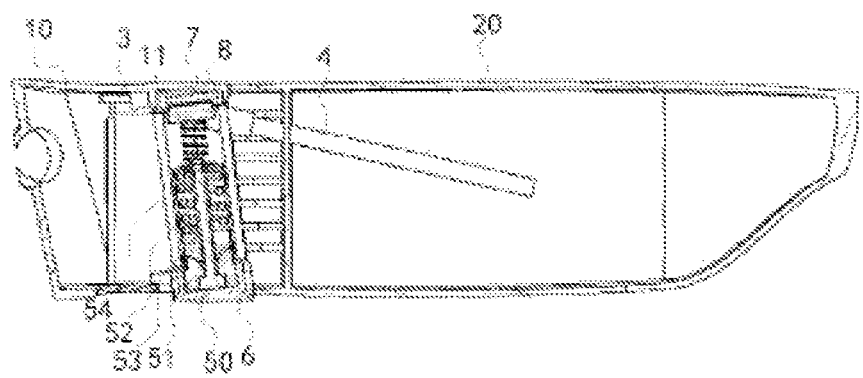
FIG. 2 is a schematic structural diagram of a pair of smart glasses.
Figure 3:
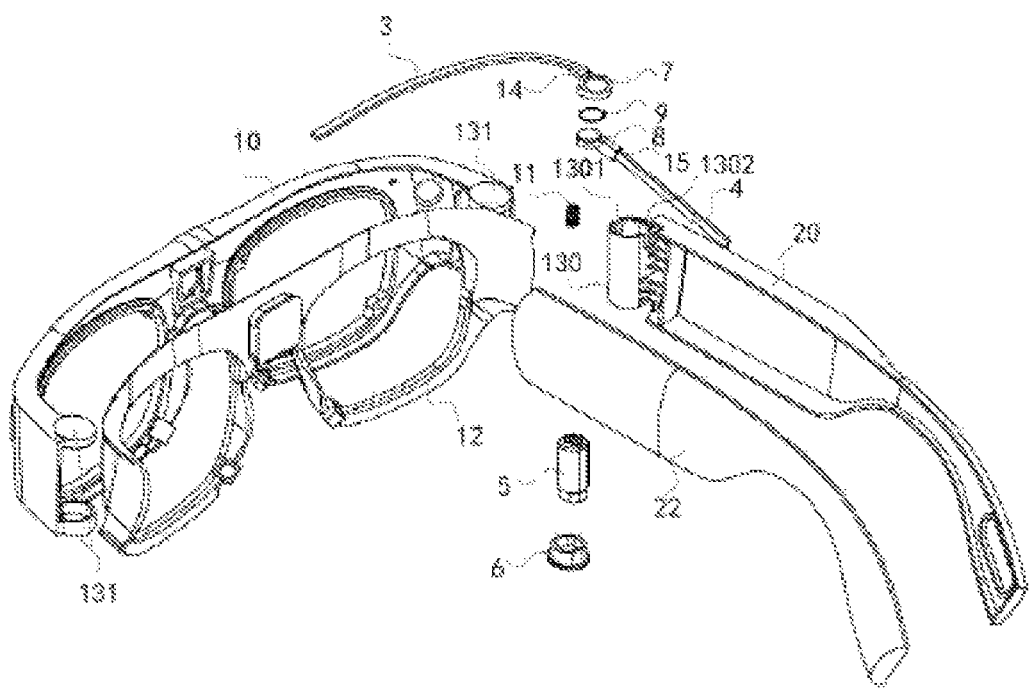
FIG. 3 is an explosive diagram of a pair of AR glasses provided by the present application.

As shown in FIG. 1 to FIG. 3. A pair of smart glasses, including a front frame 1, and legs 2 rotatably connected to the front frame 1 through a rotating module 13; a heat conducting structure is housed in the rotating module 13, and the heat conducting structure includes an upper flange 7 and a lower flange 8 that are closely fitted in an up and down direction and rotatable relative to each other; the upper flange 7 is connected to a front frame heat pipe 3 provided in the front frame 1, and the lower flange 8 is connected to a leg heat pipe 4 provided in the legs 2 and rotates with leg heat pipe 4. In the smart glasses of the present application, under the action of the rotating module 13, the legs 2 are rotatable relative to the front frame 1. The lower flange 8 rotates with the legs 2. Since the lower flange 8 and the upper flange 7 are rotatable relative to each other, the legs 2 may not be affected by the lower flange 8 and the upper flange 7 in case that the legs 2 rotates and folds. Moreover, heat on the leg heat pipe 4 may be conducted to the lower flange 8 connected thereto, and the lower flange 8 conducts the heat to the upper flange 7 closely attached thereto, and the upper flange 7 conducts the heat to the front frame heat pipe 3 connected thereto, and the heat is finally dissipated from the front frame 1 to avoid bringing bad feelings to human at legs 2 where the smart glasses contacts the human skin. Therefore, in the smart glasses of the present application, the legs and a frame are rotatably connected by a rotating module with a built-in heat conducting structure. Heat generated inside the legs is conducted to the frame through the heat conducting structure, and is dissipated outward through the frame, which improves an overall heat dissipation performance of the glasses, thereby improving the user experience.

As shown in FIG. 1 and FIG. 3, in the smart glasses of this embodiment, the front frame 1 includes a front frame front casing 10 and a front frame rear casing 12 that are buckled together, and the front frame heat pipe 3 is provided in a space enclosed by the front frame front casing 10 and the front frame rear casing 12; each of the legs 2 includes a leg casing 20 and a leg inner casing 22 that are buckled together, and the leg heat pipe 4 is provided in a space enclosed by the leg casing 20 and the leg inner casing 22, where the front and rear, inside and outside described above are distinguished from the wearer when the smart glasses are worn. The smart glass includes a left leg and a right leg which are separately provided on the left and right sides of the front frame 1; the leg heat pipe 4 is provided inside the right leg 2; the front frame heat pipe 3 is provided on a right side of the front frame 1, and the heat conducting structure is provided in the rotating module 13 connected to the right legs 2; the left leg is rotatably connected to the front frame 1 through the rotating structure, and the rotating structure includes a rotating casing and two fixing end covers covering two ends of the rotating casing; the rotating casing is fixed on the left leg, and the two fixing end covers are fixed on the front frame 1; the cam shaft assembly is provided inside the rotating structure, and the bottom end of the shaft of the cam shaft assembly is mounted on the two fixing end covers located at the bottom end through a fixing element. In this embodiment, the rotating casing has the same structure as the cylindrical casing 130, the two fixing end covers have the same structure as the end cover 131, and the fixing element has the same structure as the shaft fixing element 6. With this arrangement, the cost is reduced while ensuring heat dissipation performance.

As shown in FIG. 2 and FIG. 3, the rotating module 13 includes a cam shaft assembly 5 for outputting rotational torque, and the cam shaft assembly 5 includes a shaft 50, a torsion spring 52 and a first cam 51, an upper end and a lower end of which are both provided outside the shaft 50, and a second cam 53 provided on the first cam 51; a groove is defined at an end of the first cam 51 facing away from the torsion spring 52, and the second cam 53 is arranged in the groove; an inclination angle of an inclined surface of a junction of the first cam 51 and the second cam 53 in this embodiment is 45 degrees; a top end of the shaft 50 is arranged at the bottom end of the lower flange 8 through a supporting element. The supporting element is preferably, but not limited to, a supporting spring 11 arranged vertically, the supporting spring 11 makes the upper flange 7 and the lower flange 8 remain closely attaching to each other for high efficiency heat conduction. In this embodiment, the cam shaft assembly 5 further includes a cannular casing 54, the cannular casing 54 covers on the outside of the torsion spring 52, the second cam 53 and a junction of the first cam 51 and the second cam 53. The top end of the shaft 50 extends out of the cannular casing 54, the bottom end of the shaft 50 and the first cam 51 sleeved outside the bottom end of the shaft 50 extend out of the cannular casing 54, and are fixed on the end cover 131 at the bottom end of the rotating module 13 through the shaft fixing element 6.

Figure 4:
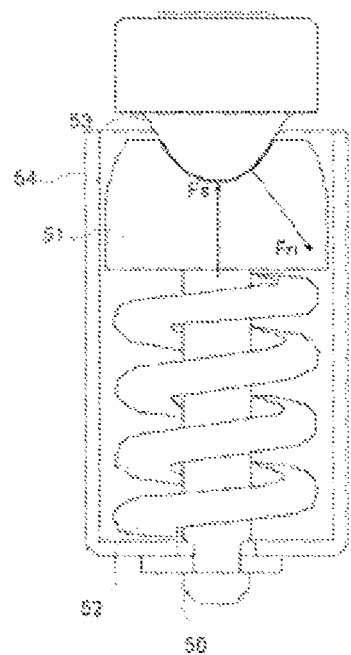
FIG. 4 is a schematic diagram of a cam shaft assembly.
Figure 5:
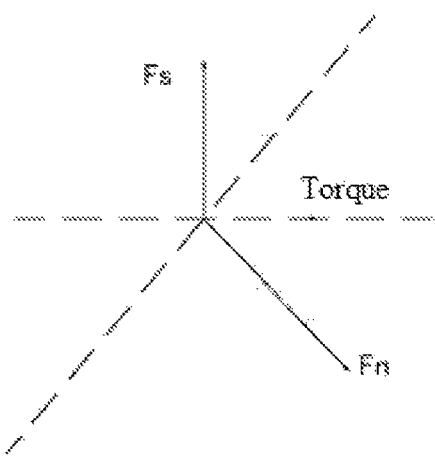
FIG. 5 is a schematic diagram of torque output by a cam shaft assembly.

As shown in FIG. 4 and FIG. 5, the working principle of the cam shaft assembly 5 is: during the rotation of the legs 2, an axial force Fs of the torsion spring 52, in the same direction as an extension direction of the shaft 50, is converted into a radial force Fn through cooperation of the first cam 51 and the second cam 53, and is converted into a torque, the torque enables the legs 2 to have a certain clamping effect for users with different head circumferences.

As shown in FIG. 1 and FIG. 3, the rotating module 13 includes a cylindrical casing 130 and an end cover 131 covering two ends of the cylindrical casing 130, where the cylindrical casing 130 is fixed on the legs 2, and the end cover 131 at two ends are fixed on the front frame 1, which is convenient for installation. A first passage groove 1301 and a second passage groove 1302 are defined on the top end of the cylindrical casing 130; the first passage groove 1301 is in communication with the rotating module 13 and the front frame 1, and the front frame heat pipe 3 passes through the first passage groove 1301 and enters the cylindrical casing 130; the second passage groove 1302 is in communication with the rotating module 13 and the legs 2, and the leg heat pipe 4 passes through the second passage groove 1302 and enters the cylindrical casing 130. The cylindrical casing 130 ensures that the upper flange 7 and the lower flange 8 have desirable heat conduction performance and rotate relatively in cooperation. The end cover 131 at the top end is covered on the upper flange 7, and the shaft fixing element 6 is provided inside the end cover 131 at the bottom end.

As shown in FIG. 1 to FIG. 3, in this embodiment, a sealing ring 9 is provided between the upper flange 7 and the lower flange 8, the sealing ring 9 makes the upper flange 7 and the lower flange 8 fully contact with each other. Moreover, a thermal conductive paste is provided between the upper flange 7 and the lower flange 8, the thermal conductive paste makes the upper flange 7 and the lower flange 8 fully contact and conduct heat.

As shown in FIG. 3, the upper flange 7 in this embodiment is provided with a first connecting rod 14, the first connecting rod 14 is fixedly connected to the front frame heat pipe 3. The upper flange 7 in this embodiment is fixedly connected to the front frame heat pipe 3 by welding and is clamped in the first passage groove 1301; the lower flange 8 is provided with a second connecting rod 15, the second connecting rod 15 is fixedly connected to the leg heat pipe 4. The lower flange 8 in this embodiment is fixedly connected to the leg heat pipe 4 by welding and is clamped in the second passage groove 1302. In addition, connection methods between the upper flange 7 and the front frame heat pipe 3 are not limited to what is listed above; connection methods between the lower flange 8 and the leg heat pipe 4 are not limited to what is listed above.

The front frame heat pipe 3, the leg heat pipe 4, the lower flange 8, and the upper flange 7 are all made of copper, which has a relatively high thermal conductivity.

In summary, in the smart glasses of the present application, the legs and a frame are rotatably connected by a rotating module with a built-in heat conducting structure. Heat generated inside the legs is conducted to the frame through the heat conducting structure, and is dissipated outward through the frame, which improves an overall heat dissipation performance of the glasses, thereby improving the user experience. Moreover, the structure is compact, which is easy to manufacture.

The various embodiments are described in a progressive manner or a parallel manner. Each of the embodiments is mainly focused on describing its differences from other embodiments, and reference may be made among these embodiments with respect to the same or similar parts. Since apparatuses disclosed in the embodiments correspond to methods disclosed in the embodiments, the description of apparatuses is simple, and reference may be made to the relevant part of methods.

The person skilled in the art can further understand that the elements and algorithm steps of each embodiment described in connection with the embodiments disclosed herein can be implemented in electronic hardware, computer software or a combination of both, in order to clearly illustrate the interchangeability of the hardware and software, the composition and steps of the various examples have been generally described in terms of function in the above description. Whether the functions are implemented by hardware or by software depends on applications and design constraints of the technical solutions. Those skilled in the art can implement the described functions using different methods for each of the specific disclosures, however, the implementation should not be considered to go beyond the scope of the present disclosure.

It should be further noted that the relationship terminologies such as "first", "second" and the like are only used herein to distinguish one entity or operation from another, rather than to necessitate or imply that the actual relationship or order exists between the entities or operations. Moreover, terms "comprising", "including", or any other variant thereof are intended to encompass a non exclusive inclusion such that processes, methods, articles, or devices that include a series of elements include not only those elements but also those that are not explicitly listed or other elements that are inherent to such processes, methods, articles, or devices. Unless explicitly limited, the statement "including a . . . " does not exclude the case that other similar elements may exist in the process, the method, the article or the device other than enumerated elements.

What is claimed is:

1. A pair of smart glasses, comprising a front frame, and legs rotatably connected to the front frame through a rotating module; wherein a heat conducting structure is housed in the rotating module, and the heat conducting structure comprises an upper flange and a lower flange that are closely fitted in an up and down direction and rotatable relative to each other; wherein the upper flange is connected to a front frame heat pipe provided in the front frame, and the lower flange is connected to a leg heat pipe provided in the legs and rotates with the leg heat pipe, wherein the rotating module comprises a cam shaft assembly for outputting rotational torque, and the cam shaft assembly comprises a shaft, a torsion spring, a first cam and a second cam, wherein an upper end and a lower end of each of the torsion spring and the first cam are both provided outside the shaft, the second cam is provided on the first cam;

wherein a groove is arranged at an end of the first cam facing away from the torsion spring, and the second cam is arranged in the groove; and wherein a top end of the shaft is arranged at a bottom end of the lower flange through a supporting element.

2. The smart glasses according to claim 1, wherein the rotating module further comprises a cylindrical casing and an end cover covering two ends of the cylindrical casing, wherein the cylindrical casing is fixed on the legs, and the end covers at two ends are fixed on the front frame;

wherein a first passage groove and a second passage groove are arranged on a top end of the cylindrical casing; wherein the first passage groove is in communication with the rotating module and the front frame, and the front frame heat pipe passes through the first passage groove and enters the cylindrical casing; the second passage groove is in communication with the rotating module and the legs, and the leg heat pipe passes through the second passage groove and enters the cylindrical casing.

3. The smart glasses according to claim 2, wherein the upper flange is provided with a first connecting rod, the first connecting rod is fixedly connected to the front frame heat pipe and is clamped in the first passage groove;

wherein the lower flange is provided with a second connecting rod, the second connecting rod is fixedly connected to the leg heat pipe and is clamped in the second passage groove.

4. The smart glasses according to claim 3, wherein a sealing ring is provided between the upper flange and the lower flange.

5. The smart glasses according to claim 4, wherein a thermal conductive paste is provided between the upper flange and the lower flange.

6. The smart glasses according to claim 2, wherein a bottom end of the shaft is fixed on an end cover located at a bottom end of the rotating module through a shaft fixing element.

7. The smart glass according to claim 2, wherein a sealing ring is provided between the upper flange and the lower flange.

8. The smart glasses according to claim 7, wherein a thermal conductive paste is provided between the upper flange and the lower flange.

9. The smart glasses according to claim 1, wherein a sealing ring is provided between the upper flange and the lower flange.

10. The smart glasses according to claim 9, wherein a thermal conductive paste is provided between the upper flange and the lower flange.

11. The smart glasses according to claim 1, wherein the supporting element is a supporting spring provided vertically.

12. The smart glasses according to claim 1, wherein the cam shaft assembly further comprises a cannular casing, the cannular casing covers on an outside of the torsion spring, the second cam and a junction of the first cam and the second cam.

13. The smart glasses according to claim 1, comprising a left leg and a right leg which are separately provided on the left and right sides of the front frame;

wherein the right leg is rotatably connected to the front frame through the rotating module, and the leg heat pipe is provided inside the right leg; wherein the front frame heat pipe is provided on a right side of the front frame, and the heat conducting structure is provided in the rotating module connected to the right legs;

wherein the left leg is rotatably connected to the front frame through the rotating structure, and the rotating structure comprises a rotating casing and two fixing end covers covering two ends of the rotating casing; wherein the rotating casing is fixed on the left leg, and the two fixing end covers are fixed on the front frame; wherein the cam shaft assembly is provided inside the rotating structure, and a bottom end of the shaft is mounted on the two fixing end covers located at a bottom end through a fixing element.

\* \* \* \* \*